(12) United States Patent
O'Neill et al.

(10) Patent No.: US 6,716,770 B2
(45) Date of Patent: Apr. 6, 2004

(54) LOW DIELECTRIC CONSTANT MATERIAL AND METHOD OF PROCESSING BY CVD

(75) Inventors: Mark Leonard O'Neill, Allentown, PA (US); Brian Keith Peterson, Fogelsville, PA (US); Jean Louise Vincent, Bethlehem, PA (US); Raymond Nicholas Vrtis, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 126 days.

(21) Appl. No.: 09/863,150

(22) Filed: May 23, 2001

(65) Prior Publication Data

US 2003/0049460 A1 Mar. 13, 2003

(51) Int. Cl.$^7$ .............................................. C23C 16/40
(52) U.S. Cl. ...................... 438/780; 438/781; 438/784; 438/789; 427/535; 427/255.31; 427/255.28; 427/255.39; 427/255.393; 427/384
(58) Field of Search ............................ 427/535, 255.31, 427/255.28, 255.39, 255.393, 384; 438/780, 781, 784, 789

(56) References Cited

U.S. PATENT DOCUMENTS

| | | | |
|---|---|---|---|
| 5,571,576 A | 11/1996 | Qian et al. ................... 427/574 |
| 5,661,093 A | 8/1997 | Ravi et al. ................... 438/763 |
| 5,700,736 A | 12/1997 | Muroyama .................. 438/622 |
| 5,703,404 A | 12/1997 | Matsuura .................... 257/758 |
| 5,800,877 A | 9/1998 | Maeda et al. ................ 427/535 |
| 5,827,785 A | * 10/1998 | Bhan et al. .................. 438/784 |
| 5,872,065 A | 2/1999 | Sivaramakrishnan ....... 438/784 |
| 5,989,998 A | 11/1999 | Sugahara et al. ............ 438/623 |
| 6,054,379 A | 4/2000 | Yau et al. .................... 438/623 |
| 6,068,884 A | * 5/2000 | Rose et al. ............... 427/255.6 |
| 6,072,227 A | 6/2000 | Yau et al. .................... 257/642 |
| 6,077,574 A | 6/2000 | Usami ........................ 427/579 |
| 6,147,009 A | * 11/2000 | Grill et al. ................... 438/780 |
| 6,159,871 A | 12/2000 | Loboda et al. .............. 438/786 |
| 6,316,063 B1 | 11/2001 | Andideh et al. ............. 427/577 |
| 6,410,463 B1 | * 6/2002 | Matsuki ....................... 438/790 |

FOREIGN PATENT DOCUMENTS

| | | | | |
|---|---|---|---|---|
| JP | 9 6321499 | 12/1996 | ......... H01L/21/314 |
| JP | 8150036 | 6/1998 | ......... H01L/21/316 |
| JP | 9 9111712 | 4/1999 | ......... H01L/21/316 |
| JP | 9 9111714 | 4/1999 | ......... H01L/21/316 |
| WO | 9941423 | 8/1999 | |

OTHER PUBLICATIONS

"Recent Progress in PECVD Low–k Dielectrics for Advanced Metallization Schemes", Lee et al., no date available.*
D. R. Sparks, "Plasma Etching of Si, SiO$_2$, Si$_3$N$_4$, and Resist with Fluorine, Chlorine, and Bromine Compounds," J. Electrochem Soc., 1992, pp. 1736–1741, vol. 139, No. 6, Kokomo, Indiana.

R. D. Dresdner, et al., "Fluorocarbon Nitrogen Compounds. V. Nitrogen Trifluoride as a Reagent in Fluorocarbon Chemistry," Nitrogen Trifluoride as a Reagent in Flouorocarbon Chemistry, 1960, pp. 5831–5834, Gainesville, Florida.
U. Biermann, et al., "Reactions of Nitrogen Trifluoride and Tetrafluorohy–drazine with Various Cyano Compounds," Physical Organic Chemistry, 1968, p. 2039, vol. 68, Germany.
R. E. Anderson, et al., "Nitrogen Trifluoride, Systems Design Criteria," USAF Propellant Handbooks, 1978, vol. 3, Part A, Sacramento, California.
T. Takagi, et al., "The Synthesis of Perfluoroamine Using Nitrogen Trifluoride," Journal of Fluorine Chemistry, 2000, pp. 15–17, vol. 101, Japan.
"Recent Progress In PECVD Low–k Dielectrics for Advanced Metallization Schemes", Lee, et al., no date available.
"Addressing The Challenges..", micromagazine.com MICRO Feb. 2001.
Japanese Journal of Applied Physics, vol. 38 (1999) pp. 2368–2372.
Japanese Journal of Applied Physics, vol. 37 (6369–6373, (1998).
Electrochemical Soc. Proceedings vol. 98–3. pp. 163–168, (1998).
Japanese Journal of Applied Physics vol. 38 (1999) pp. 4520–4526.
IEEE Intl. Conference Conduction and Breakdown . . . Jun. 1998, Vasteras, Sweden.
Japanese Journal of Applied Physics vol. 37 (1998) pp. 4904–4909.
Journal of Applied Physics vol. 87, No. 8, Apr. 15, 2000.
Thin Solid Films 337 (1999) pp. 67–70.
Mat. Res. Soc. Symposium Proc. vol. 606, pp. 57–62, no date available.
"PE–CVD of Fluorocarbon/SiO . . . ", Plasmas and Polymers, vol. 4, No. 1, 1999.
"Low Dielectric Constant CF/SiOF . . . ", Yun, et al, Thin Solid Films 341 (1999) pp. 109–111.

* cited by examiner

*Primary Examiner*—Timothy Meeks
(74) *Attorney, Agent, or Firm*—Rosaleen P. Morris-Oskanian

(57) ABSTRACT

Organofluorosilicate glass films contain both organic species and inorganic fluorines, exclusive of significant amounts of fluorocarbon species. Preferred films are represented by the formula $Si_vO_wC_xH_yF_z$, where v+w+x+y+z=100%, v is from 10 to 35 atomic %, w is from 10 to 65 atomic % y is from 10 to 50 atomic %, x is from 1 to 30 atomic %, z is from 0.1 to 15 atomic %, and x/z is optionally greater than 0.25, wherein substantially none of the fluorine is bonded to the carbon. A CVD method includes: (a) providing a substrate within a vacuum chamber; (b) introducing into the vacuum chamber gaseous reagents including a fluorine-providing gas, an oxygen-providing gas and at least one precursor gas selected from an organosilane and an organosiloxane; and (c) applying energy to the gaseous reagents in the chamber to induce reaction of the gaseous reagents and to form the film on the substrate.

56 Claims, 6 Drawing Sheets

LOW DIELECTRIC CONSTANT MATERIAL AND METHOD OF PROCESSING BY CVD

BACKGROUND OF THE INVENTION

The electronics industry utilizes dielectric materials as insulating layers between circuits and components of integrated circuits and associated electronic devices. Line dimensions are being reduced in order to increase speed and storage capability of microelectronic devices (e.g., computer chips). Microchip dimensions have undergone a significant decrease even in the past decade such that line widths previously greater than 1 micron are being decreased to 0.18 microns, with future plans on the drawing boards of at least as low as 0.07 microns. The time delay expression $T=\frac{1}{2}RCL^2$, where T is the delay time, R is the resistance of the conductive line, C is the capacitance of the dielectric layer, and L is the wire length, is often used to define the effects that changes in dimensions and materials can have on the propagation of signals in a circuit. The capacitance can be expressed as $C=k_o k (S/d)$, where $k_o$ is the vacuum permitivity or dielectric constant (equal to 1.0), k is the dielectric constant for the thin film, S is the electrode surface area and d is the film thickness. Thus, a decrease in k will result in a proportional reduction in C and consequently a reduction in delay time. Further, as the line dimensions decrease, better insulating materials with lower dielectric constants are also needed to prevent signal crossover (aka crosstalk) between the chip components, which can have a negative effect on performance.

Historically, silica with a dielectric constant (k) of 4.2–4.5 has been employed as the interlayer dielectric (ILD). However, at line dimensions of 0.25 microns and less, silica may no longer be acceptable, and it has been extensively replaced by other materials, such as fluorinated silica glass (FSG) wherein k is about 3.6. The addition of fluorine to silica specifically aimed at reducing the k value from that of undoped silica has been studied for the past few years (see, e.g., U.S. Pat. Nos. 5,571,576, 5,661,093, 5,700,736, 5,703,404, 5,827,785 and 5,872,065). The high electronegativity of fluorine results in a very non-polarizable species, which reduces the dielectric constant. Fluorinated silica has gained acceptance in the industry and is being used for the current generation of ICs.

While fluorinated silica materials have the requisite thermal and mechanical stability to withstand very high temperatures (up to 500° C.), the materials' properties (e.g., low water sorption, mechanical properties) are susceptible to being compromised when large amounts of fluorine are incorporated into the material. Fluorinated organic materials, such as poly(tetrafluoroethylene) despite having very low k values down to 2.0 or less, have not shown sufficient stability to the temperatures experienced during subsequent processing steps involved in the manufacture of an integrated circuit. Organic polymers in general do not possess sufficient mechanical strength for processing under current conditions. As well, fluorocarbon polymers can have other drawbacks such as poor adhesion, potential reaction with metals at high temperature, and poor rigidity at high temperature in some cases. In order to achieve the desired property characteristics and low dielectric constant values, silica based dielectric films which incorporate both organic dopants and inorganic fluorine species may provide for films with k values lower than FSG, and better thermal and mechanical properties than organosilica glass (OSG) materials, while maintaining the requisite properties to function as an interlayer/intermetal material in IC manufacturing.

More recently, OSG is being sought as the replacement for FSG. OSG materials are being touted as the future interlayer/intermetal dielectric of choice produced by CVD techniques. Numerous patents have been issued covering the use of various organosilanes for the production of thin films with k values of about 2.7–3.2 (see, e.g., U.S. Pat. Nos. 5,989,998, 6,054,379, 6,072,227, 6,147,009 and 6,159,871, and WO 99/41423). OSG thin film dielectric materials are being commercialized and/or advertised by several leading OEMs for future ICs due to their inherently lower k (<3.2) relative to FSG. However, the reduction in k must be balanced against detrimental effects that organic species typically have, which include reduced mechanical properties, thermal stability and chemical resistance. Studies have indicated that the preferred materials properties for OSG limit the dielectric constant to the range of 2.8–3.2 with modulus/hardness values in the range of 9–11/1.2–1.4 GPa (see Lee et al., 198th Meeting of The Electrochemical Society, October 2000, Section H-1, Abstract No. 531; and Golden et al., MICRO, p. 31, February 2001).

Some recent literature and patents have proposed the use of carbon-doped FSG materials. Most of these examples exclusively utilize fluorocarbon materials as precursors in combination with a silicon precursor source, and incorporate fluorocarbon moieties into a silica or FSG framework. For example, Shirafuji et al. plasma copolymerized hexamethyldisiloxane with octafluorobutene (Plasmas and Polymers, 4(1) (57–75) March 1999 or tetrafluoroethylene (38 Jpn. J. Appl. Phys. 4520–26 (1999)) to produce fluorocarbon/SiO composite films in which k increased from 2.0 to 3.3 with decreasing fluorocarbon content. Yun et al. (341 (1,2) Thin Solid Films 109–11 (1999)) discuss the effects of fluorocarbon addition to SiOF films produced in a helicon plasma reactor using triethoxyfluorosilane and $O_2$.

Another example of the specific inclusion of fluorocarbon moieties in silica is the work of Kim et al., 1998 IEEE International Conference On Conduction and Breakdown in Solid Dielectrics 229–32 (1998), describing the ability of fluorocarbon addition to reduce the k of the material substantially from that of silica. The work of Kim et al. appears to be aimed specifically at incorporating fluorocarbon moieties through the use of $CF_4$ in a 2% silane/$N_2$ plasma to produce films containing silicon, oxygen, carbon, fluorine, and N, where they were able to identify Si—C, Si—N, Si—O, and C—F functionalities. They also found that there was a depth profile to their compositions, whereby the surface was higher in oxygen than the bulk.

U.S. Pat. No. 5,800,877 to Maeda et al. describes the use of a mixture of organosilane precursors having an Si—F bond and organosilane precursors without an Si—F bond, with ozone or oxygen, in a thermal process to produce a fluorine-containing silicon oxide film. The claims of this patent cover the production of a fluorine-containing silicon oxide via thermal process with an oxygen and/or nitrogen plasma post-treatment. The patent does not describe the incorporation of alkyl groups or carbon into the film.

In a paper by Hasegawa et al. (37 Jpn. J. Appl. Phys. 4904–09 (1998)), enhanced water resistance of fluorinated silica was the motivation for deposition using mixtures of silane, oxygen, $CF_4$ and ammonia in a plasma-enhanced CVD system. The deposited films were found to contain a significant amount of Si—N and C—F bonds, as interpreted by XPS spectra. Enhancing the water resistance via incorporation of Si—N will negatively impact the k value.

In similar works by the same group noted above, Lubguban et al. (337 Thin Solid Films 67–70 (1999), 606 Materials Research Society Symposium Proceedings 57 (2000), and 87(8) Journal of Applied Physics 3715–22 (2000)) discuss the introduction of carbon into fluorosilicate glass by PE-CVD to enhance water resistivity. The materials were synthesized from silane or TEOS, oxygen, methane and perfluoromethane, and were studied for composition, thermal stability, and electrical properties. Lubguban et al. suggest that the incorporation of both carbon and fluorine into a $SiO_2$ network reduces the dielectric constant. Increases in the amount of methane introduced to the deposition chamber during reaction resulted in increased carbon and fluorine in the final material, said to be caused by a significant contribution by C—F functionalities. As described in their papers, the presence of C—F and C—H species will promote resistance to water sorption and help to reduce dielectric constant.

In a Japanese patent by Fujitsu (JP10150036A2), organosilicon materials deposited by a spin coat method had a post-deposition treatment with $F_2$ or $NF_3$ in a plasma reactor to increase heat resistance, reduce water sorption, and increase material reliability of the film through the formation of fluorocarbon species in the film. Other Fujitsu patents (JP 8321499A2 and JP 11111712A2) also discuss the formation of silica films with incorporated fluorocarbon species by plasma CVD using silicon-based precursors containing fluorocarbon groups.

Uchida et al. disclose fluorinated organic-silica films for improved moisture tolerance. See, e.g., 98(3) Electrochem. Soc. 163–8 (1998), 37 Jpn. J. Appl. Phys. 6369–73 (1998), 38 Jpn. J. Appl. Phys. 2368–72 (1999) and JP 11111714A. In these papers, the authors indicate that the properties of FSG and OSG may be complementary, such that a material that has both functionalities may take advantage of their strengths, although little supporting data is given. The authors attempt to show this asserted advantage by describing a process in which an organosilicon material was deposited in a thermal process from a mixture of tertiary methylamine (TMA), tetraisocyanate-silane (TICS), dimethyldiisocyanate-silane (DMSIC) and preferably dimethylethylamine (DMA), to produce H and OH—free silica films. This deposited film was post-treated with HF gas in a thermal process to replace isocyanate species with fluorine, and produced films with a lower dielectric constant and better moisture tolerance. The films produced, however, included C—Si and C—F functionalities. Also, as is typical in diffusional-based processes such as chemical post-treatments, there resulted a compositional gradient induced through the depth of the film. It is inherently difficult to control the amount and uniformity of the chemical modification through the film in this manner.

U.S. Pat. No. 6,077,574 to Usami discloses processes for forming a plasma CVD silicon oxide dielectric film doped with specified amounts of fluorine and carbon, wherein the film is deposited from a mixture of feed gases, which can control the fluorine concentration and the carbon concentration independently of each other. The atomic ratio ([carbon]/[fluorine]) in these films is less than or equal to 0.25, based on the disclosed concentration ranges of $4.0 \times 10^{21}$ fluorine atoms/cc to $1.0 \times 10^{22}$ fluorine atoms/cc, and $3.0 \times 10^{19}$ carbon atoms/cc to $1.0 \times 10^{21}$ carbon atoms/cc. No data are presented regarding the functionalities formed within the film. Given that the density of silica is about 2.2 grams/cc, which is equivalent to $6.6 \times 10^{22}$ atoms/cc, the concentration of fluorine and carbon can be estimated to be about 6–15 atomic % fluorine and about 0.05 to 1.5 atomic % carbon.

Despite the foregoing developments, there have not been any examples in the prior art that successfully combine the desired mechanical, dielectric, thermal and oxidative stability properties that are paramount for integrating low k dielectric materials in integrated circuits.

All references cited herein are incorporated herein by reference in their entireties.

BRIEF SUMMARY OF THE INVENTION

The invention provides films of carbon-doped fluorosilicate glass (i.e., CFSG or OFSG—organofluorosilicate glass) containing both organic species and inorganic fluorines, exclusive of significant amounts of fluorocarbon species.

More specifically, preferred films of the invention are represented by the formula $Si_vO_wC_xH_yF_z$, where v+w+x+y+z=100%, v is from 10 to 35 atomic %, w is from 10 to 65 atomic %, y is from 10 to 50 atomic %, x is from 2 to 30 atomic %, and z is from 0.1 to 15 atomic %, wherein substantially none of the fluorine is bonded to the carbon.

Also provided are films represented by the formula $Si_vO_wC_xH_yF_z$, where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, provided that x/z>0.25, wherein substantially none of the fluorine is bonded to the carbon.

The invention further provides a chemical vapor deposition method for producing such films, comprising: (a) providing a substrate within a vacuum chamber; (b) introducing into the vacuum chamber gaseous reagents including a fluorine-providing gas, an oxygen-providing gas, and at least one precursor gas selected from the group consisting of an organosilane and an organosiloxane; and (c) applying energy to the gaseous reagents in said chamber to induce reaction of the gaseous reagents and to form the film on the substrate.

Still further provided is an improved method for producing an organosilica glass by chemical vapor deposition of an organosilane, wherein the improvement comprises co-depositing with at least a portion of the organosilane an inorganic fluorine from an inorganic fluorine source.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1A:
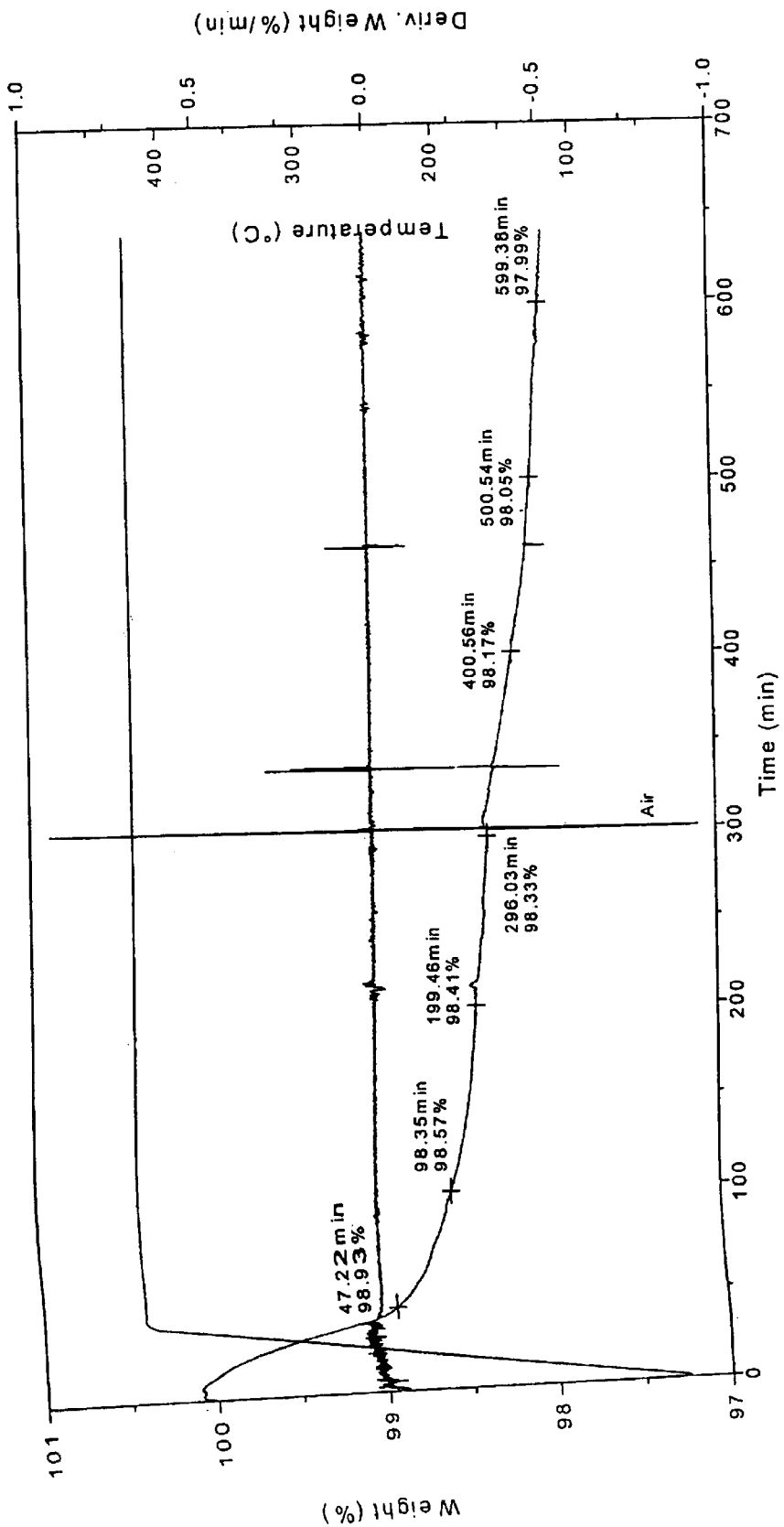
FIG. 1a shows an isothermal TGA of an embodiment of a film of the invention.

Preferred embodiments of the invention provide a thin film material having a low dielectric constant and improved mechanical properties, thermal stability, and chemical resistance (to oxygen, aqueous environments, etc.) relative to OSG materials. This is the result of the incorporation into the film of carbon (which may be silicon carbide, but is preferably predominantly in the form of organic carbon, —CHx, where x is 1 to 3) and inorganic fluorine (e.g., Si—F bonds) without the production of significant amounts of organic fluorine (e.g., C—F bonds). Thus, the final thin film material preferably comprises Si—O, Si—F, C—H and Si—C bonding structure, substantially free of, and more preferably completely free of any C—F bonds, and preferably most of the hydrogen is bonded to carbon. Lesser portions of other functionalities, such as, e.g., Si—H, C—O and O—H, may also be present in certain films of the invention.

Thus, preferred embodiments of the invention comprise: (a) about 10 to about 35 atomic %, more preferably about 20 to about 30% silicon; (b) about 10 to about 65 atomic %, more preferably about 20 to about 40 atomic % oxygen; (c)

about 10 to about 50 atomic %, more preferably about 20 to about 40 atomic % hydrogen; (d) about 1 to about 30 atomic %, more preferably about 5 to about 25 atomic % carbon; and (e) about 0.1 to about 15 atomic %, more preferably about 0.5 to about 7.0 atomic % fluorine. Lesser portions of other elements may also be present in certain films of the invention.

Both FSG and OSG materials are considered to be low k materials as their dielectric constant is less than that of the standard material traditionally used in the industry—silica glass. The combination of both inorganic fluorine and organic carbon doping to the film results in a coupled effect on the k of the final material. This may manifest itself in different ways. For example, the film may be of comparable mechanical properties as an OSG material but with a lower k, or may be of comparable k but with superior mechanical properties.

Incorporation of methyl groups into a silica film may impart nanoporosity to the film, which helps to reduce the k of the film, but can also reduce the mechanical properties of the film. Films of the invention preferably contain about 1 to about 30 atomic % carbon or about 2 to about 30 atomic % carbon, wherein most of the hydrogen is attached to carbon. Preferably, a portion of the C—H functionalities are in methyl groups. In general, the introduction of porosity is an effective method to reduce the dielectric constant of a material. While the addition of porosity will impact the mechanical and heat transfer properties of the film (e.g., extensive properties), it will not change the inherent chemical or thermal stability of the film.

Certain embodiments of the films are nanoporous relative to silica. Silica produced by PE-CVD TEOS has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Films of the invention preferably have a density of less than 2.0 g/cc, or alternatively, less than 1.5 g/cc. Such low densities can be achieved by adding a porogen to the gaseous reagents and/or post-treating the deposited material.

Films of the invention have improved properties relative to OSG materials. A given OFSG material will have mechanical properties superior to those of an OSG material of equivalent stoichiometry, but for the lack of any fluorine in the OSG material. For example, preferred embodiments of OFSG materials of the invention have a dielectric constant of less than 3.5, more preferably less than 3.0. In certain embodiments, the film has a dielectric constant in the range from 2.8 to 3.2, with a modulus of elasticity greater than 10 GPa and/or a nanoindentation hardness greater than 1.5 GPa.

Films of the invention are thermally stable, with good chemical resistance. In particular, the films have an average weight loss of less than 1.0 wt %/hr isothermal at 425° C. under $N_2$ and/or an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer, an intermetal dielectric layer, a capping layer, a chemical-mechanical planarization (CMP) or etch stop layer, a barrier layer (e.g., against diffusion of metals, water or other materials that can be undesirable in insulating layers) and/or an adhesion layer in an integrated circuit. The films can form a conformal coating. The mechanical properties exhibited by these films make them particularly suitable for use in Al subtractive technology and Cu damascene technology.

The films are compatible with chemical mechanical planarization and anisotropic etching, and are capable of adhering to a variety of materials, such as silicon, $SiO_2$, $Si_3N_4$, OSG, FSG, silicon carbide, antireflective coatings, photoresists, organic polymers, porous organic and inorganic materials, metals such as copper and aluminum, and metal barrier layers.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits.

In addition to the inventive product, the present invention includes the process through which the product is made and methods of using the product.

In certain embodiments, the invention comprises an improved process for depositing OSG by chemical vapor deposition, wherein a source of inorganic fluorine codeposits inorganic fluorine during at least a portion of the deposition of an OSG material to produce a film substantially free of organic fluorine. Thus, the invention can be used to improve prior, contemporary and future processes, including those disclosed and claimed in U.S. Pat. Nos. 6,054,379, 6,147,009 and 6,159,871 and WO 99/41423. Products produced by the improved process enjoy improved properties relative to conventionally-produced products. Preferably, at least one mechanical property of the film is increased by at least 10%, the thermal stability of the film is increased, the chemical stability of the film is increased and/or the environmental stability of the film is increased.

The process to obtain a film having a low dielectric constant comprises the steps of: (a) providing a substrate within a vacuum chamber; (b) introducing into the vacuum chamber gaseous reagents including a fluorine-providing gas, an oxygen-providing gas and at least one precursor gas selected from the group consisting of an organosilane and an organosiloxane; and (c) applying energy to the gaseous reagents in said chamber to induce reaction of the gaseous reagents and to form the film on the substrate.

Preferably, the substrate is a semiconductor.

Organosilanes and organosiloxanes are the preferred precursor gases. Suitable organosilanes and organosiloxanes include, e.g.: (a) alkylsilanes represented by the formula $R^1_n SiR^2_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, trimethylphenoxysilane and phenoxysilane); (b) a linear organosiloxane represented by the formula $R^1(R^2_2SiO)_n SiR^2_3$ where n is an integer from 1 to 10, or cyclic organosiloxane represented by the formula $(R^1R^2SiO)_n$ where n is an integer from 2 to 10 and $R^1$ and $R^2$ are as defined above (e.g., 1,3,5,7- tetramethylcyclotetrasiloxane, octamethylcyclotetrasiloxane, hexamethylcyclotrisiloxane, hexamethyidisiloxane, 1,1,2,2-tetramethyldisiloxane, and octamethyltrisiloxane); and (c) a linear organosilane oligomer represented by the formula $R^2(SiR^1R^2)_nR^2$ where n is an integer from 2 to 10, or cyclic organosilane represented by the formula $(SiR^1R^2)_n$, where n is an integer from 3 to 10, and $R^1$ and $R^2$ are as defined above (e.g., 1,2-dimethyldisilane, 1,1,2,2-tetramethyldisilane, 1,2-dimethyl-1,1,2,2-dimethoxydisilane, hexamethyidisilane, octamethyltrisilane, 1,2,3,4,5,6-hexaphenylhexasilane, 1,2-dimethyl-1,2-diphenyldisilane and 1,2-diphenyldisilane).

In certain embodiments, the organosilane/organosiloxane is a cyclic alkylsilane, a cyclic alkoxysilane or contains at least one alkoxy or alkyl bridge between a pair of silicon atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene or 1,3-(dimethylsilyl)cyclobutane.

In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate and di-tert-butoxydiacetoxysilane.

Preferred fluorine-providing gases lack any F—C bonds (i.e., fluorine bonded to carbon), which could end up in the film. Thus, preferred fluorine-providing gases include, e.g., $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds. Additional preferred fluorine-providing gases include the above mentioned alkylsilanes, alkoxysilanes, linear and cyclic organosiloxanes, linear and cyclic organosilane oligomers, cyclic or bridged organosilanes, and organosilanes with reactive side groups, provided a fluorine atom is substituted for at least one of the silicon substituents, such that there is at least one Si—F bond. More specifically, suitable fluorine-providing gases include, e.g., fluorotrimethylsilane, difluorodimethylsilane methyltrifluorosilane, flurotriethoxysilane, 1,2-difluoro-1,1,2,2,-tetramethyldisilane, or difluorodimethoxysilane.

Suitable oxygen-providing gases include, e.g., $O_2$, $N_2O$, ozone, hydrogen peroxide, NO, $NO_2$, $N_2O_4$, or mixtures thereof.

It is within the scope of the invention for a single species of molecule to function as more than one of the precursor gas, the oxygen-providing gas and the fluorine-providing gas. That is, the precursor gas, the oxygen-providing gas and the fluorine-providing gas are not necessarily three different gases. For example, it is possible to use dimethoxymethylfluorosilane to provide silicon, carbon, oxygen and fluorine. It is also possible to use a single gas to act as a precursor and oxygen-providing gas (e.g., tetraethoxysilane, trimethylsilylacetate or dimethoxydimethylsilane, each of which provides carbon, oxygen and silicon), to use a single gas to act as a precursor and a fluorine-providing gas (e.g., trimethylfluorosilane, which provides carbon, fluorine and silicon), etc. In any case, it is preferred to avoid the use of any reagents containing C—F functionalities.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In certain embodiments, mixtures of different organosilanes and/or organosiloxanes are used in combination. It is also within the scope of the invention to use combinations of multiple different fluorine-providing gases and/or combinations of multiple different oxygen-providing agents along with or separate from combinations of different organosilanes and/or organosiloxanes. Moreover, it is also within the scope of the invention to use a fluorinated organosilane (to provide fluorine and/or carbon) along with a non-fluorinated organosilane (to provide carbon).

In addition to the fluorine-providing gas, the oxygen-providing gas and the organosilane/organosiloxane, additional materials can be charged into the vacuum chamber prior to, during and/or after the deposition reaction. Such materials include, e.g., inert gas (e.g., He, Ar, $N_2$, Kr, Xe, etc., which may be required as a carrier gas for lesser volatile precursors and/or which can promote the annealing of the as-deposited materials and provide a more stable final film) and reactive substances, such as gaseous or liquid organic substances, $NH_3$, $H_2$, $CO_2$, or CO. Organic substances, such as, e.g., $CH_4$, $C_2H_6$, $C_2H_4$, $C_2H_2$, $C_3H_8$, benzene, naphthalene, toluene and styrene and can provide carbon for inclusion in the inventive films.

Energy is applied to the gaseous reagents to induce the gases to react and to form the film on the substrate. Such energy can be provided by, e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate.

The flow rate for each of the gaseous reagents preferably ranges from 10 to 5000 sccm, more preferably from 200 to 2000 sccm, per single 200 mm wafer. The individual rates are selected so as to provide the desired amounts and ratios of fluorine, carbon, etc. in the film. The actual flow rates needed may depend upon wafer size and chamber configuration, and are in no way limited to 200 mm wafers or single wafer chambers.

It is preferred to deposit the film at a deposition rate of at least 50 nm/min.

The pressure in the vacuum chamber during deposition is preferably 0.01 to 600 torr, more preferably 1 to 10 torr.

A preferred recipe of the invention based on using trimethyl silane as the organosilane precursor is shown in the Table 1 below for 200 mm silicon wafer substrate.

TABLE 1

| | |
|---|---|
| Pressure (torr) | 4.0 |
| Substrate temperature (° C.) | 350 |
| Spacing (mil) | 320 |
| RF power (Watts) | 400 |
| Trimethylsilane flow (sccm) | 540 |
| $O_2$ flow (sccm) | 90 |
| $SiF_4$ flow (sccm) | 250 |

Preferably, the inventive process is completed in a single process step with high throughput. Without wishing to be bound by any theories, it is believed that the process of the invention provides films having more uniform distribution of inorganic fluorine throughout the entire cross-section of the film, unlike multistep post-treatment fluorination processes, such as taught by Uchida et al. In addition, any insubstantial amounts of organic fluorine present in films of the invention (wherein "insubstantial" is herein defined for this purpose as being less than 5% of the total fluorine content, more preferably less than 1% of the total fluorine content) is also more uniformly distributed throughout the entire cross-section of the film and is not centrally concentrated.

Although a single process step is preferred in many instances, it is also within the scope of the invention to post-treat the film after deposition. Such post-treating can include, e.g., at least one of thermal treatment, plasma treatment and chemical treatment.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.,g., a 10 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.5).

The invention will be illustrated in more detail with reference to the following Examples, but it should be understood that the present invention is not deemed to be limited thereto.

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, deposition, and purge/evacuation of chamber prior to wafer removal. Subsequently, a chamber clean was performed after each deposition using an in situ $C_2F_6+O_2$ clean followed by a chamber seasoning step.

Dielectric constants were determined using Hg probe technique on low resistivity p-type wafers (<0.02 ohm-cm), mechanical properties were determined using MTS Nano Indenter, thermal stability and off-gas products were determined by thermogravimetric analysis on a Thermo TA Instruments 2050 TGA coupled to a MIDAC infrared spectrometer (TGA-IR). $^{13}$C-NMR data were obtained on a Bruker ASX-200, compositional data were obtained by x-ray photoelectron spectroscopy (XPS) on a Physical Electronics 5000LS.

Comparative Examples 1–6 were produced in accordance with the teachings of U.S. Pat. Nos. 6,159,871 and 6,054,379, and WO 99/41123, and are tabulated in Table 2 below.

TABLE 2

Data for OSG depositions from trimethylsilane and oxygen

| Comparative Example No. | 1 | 2 | 3 | 4 | 5 | 6 |
|---|---|---|---|---|---|---|
| Substrate Temp. (° C.) | 350 | 350 | 350 | 350 | 350 | 350 |
| Thickness (nm) | 668 | 633 | 661 | 669 | 1324 | 643 |
| Uniformity (+/-) | | 8 | 6 | 7 | 12 | 5 |
| Refractive Index | 1.442 | 1.439 | 1.444 | 1.441 | 1.431 | 1.4445 |
| Uniformity (+/-) | | 0.0073 | 0.0070 | 0.0090 | 0.0073 | 0.0047 |
| Average Cap./Hg (pF) | 38 | 39.1 | | 37.5 | 20.9 | |
| Dielectric Constant | 3.03 | 2.97 | | 2.99 | 3.02 | |
| Adhesion (Tape Pull) | 100% | 100% | 100% | 100% | 100% | 100% |
| Young's Modulus (GPa) | 8.7 | 9.0 | 8.4 | 7.6 | 7.1 | 8.2 |
| NI hardness (GPa) | 1.4 | 1.4 | 1.3 | 1.1 | 1.1 | 1.3 |
| Elemental (XPS) % C | | 22.2 | 23.3 | 23.5 | 23.5 | 22.4 |
| % Si | | 32.7 | 35.2 | 35 | 35.1 | 35.3 |
| % O | | 44.3 | 41.1 | 41.2 | 41.4 | 42.3 |
| % F | | 0 | 0 | 0 | 0 | 0 |

Note: Atomic % hydrogen not determined by XPS for Table 2.

Physical studies of several different films produced in accordance with the invention are tabulated in Table 3 below (Note: Atomic % hydrogen not determined by XPS for Table 3).

TABLE 3

| Example No. | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| Deposition Rate (nm/min) | 278 | 343 | 197 | 375 | 463 | 953 | 684 | 1260 | 863 | 619 | 685 | 321 | 625 | 614 | 615 | 279 | 1213 | 436 | 701 | 842 |
| Plasma Power (W) | 400 | 400 | 300 | 700 | 400 | 1000 | 600 | 1000 | 1000 | 600 | 600 | 400 | 600 | 600 | 600 | 400 | 1000 | 400 | 400 | 700 |
| Spacing (mil) | 320 | 200 | 260 | 200 | 260 | 260 | 260 | 260 | 320 | 200 | 200 | 200 | 260 | 260 | 260 | 320 | 320 | 265 | 200 | 260 |
| Chamber Pressure (torr) | 4.0 | 4.0 | 4.0 | 3.25 | 3.80 | 4.0 | 4.0 | 4.0 | 4.0 | 4.0 | 4.0 | 6.0 | 4.0 | 4.0 | 4.0 | 4.0 | 3.0 | 5.0 | 3.0 | 5.50 |
| Time (sec) | 180 | 120 | 150 | 90 | 90 | 45 | 45 | 45 | 45 | 45 | 90 | 90 | 45 | 90 | 90 | 180 | 45 | 45 | 45 | 60 |
| Substrate Temp (° C.) | 350 | 350 | 350 | 400 | 400 | 350 | 350 | 350 | 350 | 350 | 350 | 350 | 350 | 350 | 350 | 350 | 400 | 250 | 250 | 350 |
| Gas Flow (sccm) | | | | | | | | | | | | | | | | | | | | |
| Trimethylsilane | 540 | 540 | 540 | 540 | 370 | 540 | 540 | 540 | 540 | 540 | 540 | 540 | 540 | 540 | 540 | 540 | 540 | 540 | 540 | 370 |
| O₂ | 90 | 90 | 90 | 100 | 150 | 90 | 150 | 150 | 90 | 90 | 90 | 90 | 90 | 90 | 90 | 90 | 200 | 50 | 200 | 100 |
| SiF₄ | 250 | 250 | 250 | 100 | 250 | 250 | 250 | 250 | 250 | 250 | 100 | 100 | 250 | 250 | 250 | 250 | 100 | 100 | 540 | 100 |
| He post-treatment | | | | | | | | | | | | | | | 20 sec | | | | | |
| Thickness (nm) | 835 | 686 | 493 | 563 | 695 | 715 | 513 | 945 | 647 | 464 | 1027 | 481 | 469 | 921 | 923 | 837 | 910 | 327 | 526 | 842 |
| Uniformity (+/−) | 6 | 4 | 4 | | | 6 | 5 | 7 | 12 | 3 | 6 | 11 | 6 | 7 | 9 | 8 | 16 | 10 | 7 | 23 |
| RI | 1.4194 | 1.433 | 1.4182 | 1.5101 | 1.4356 | 1.527 | 1.436 | 1.455 | 1.499 | 1.453 | 1.449 | 1.403 | 1.452 | 1.432 | 1.458 | 1.416 | 1.475 | 1.444 | 1.432 | 1.4419 |
| Uniformity (+/−) | 0.0039 | 0.0024 | 0.0031 | | | 0.0071 | 0.0055 | 0.0112 | 0.0073 | 0.0076 | 0.0074 | 0.0074 | 0.0056 | 0.0068 | 0.0132 | 0.0063 | 0.0059 | 0.0131 | 0.0068 | 0.0059 |
| Avg. Cap/Hg (pF) | 31.1 | 37.7 | 50.8 | 48.2 | 40 | 39.3 | 47.8 | 29.8 | 42.4 | 55.1 | 26.7 | 49.8 | 54.7 | 29.6 | 29.6 | 31 | 31 | 71.2 | 50 | 30.9 |
| Dielectric Constant | 3.03 | 3.09 | 3.08 | 3.32 | 3.34 | 3.37 | 3.00 | 3.27 | 3.32 | 3.17 | 3.13 | 2.94 | 3.18 | 3.16 | 3.17 | 3.03 | 3.29 | 2.94 | 3.23 | 3.03 |
| Adhesion (tape pull) | 100% | 100% | 100% | 100% | 100% | 100% | 100% | 100% | 100% | 100% | 100% | 100% | 100% | 100% | 100% | 100% | 100% | 100% | 100% | 100% |
| Young's Modulus | 11.0 | 12.9 | 15.8 | 22.2 | 19.8 | 18.0 | 14.6 | 14.0 | 15.7 | 13.5 | 11.1 | 13.8 | 12.9 | 11.8 | 11.8 | 10.6 | 20.6 | 8.3 | 13.4 | 8.0 |
| NI Hardness | 1.9 | 2.2 | 2.5 | 3.4 | 3.3 | 2.8 | 2.3 | 2.3 | 2.4 | 2.2 | 1.7 | 1.6 | 2.1 | 2.0 | 2.0 | 1.8 | 3.4 | 1.3 | 2.3 | 1.3 |
| Elemental (XPS) | | | | | | | | | | | | | | | | | | | | |
| % C | | | | | | 20.5 | 12.2 | 14.5 | 19.3 | 17 | 19.6 | 19.5 | 21.6 | 22.3 | 27.1 | 15.4 | 15.8 | 22.9 | 13.8 | 23.8 |
| % Si | | | | | | 34.7 | 34.3 | 32.1 | 33.3 | 33.1 | 32.6 | 33 | 35.4 | 35 | 32.1 | 35.7 | 35.3 | 35.4 | 35.3 | 34.8 |
| % O | | | | | | 36.4 | 48.4 | 45.8 | 39 | 43.3 | 42.8 | 44.5 | 38.8 | 38.4 | 37.1 | 46 | 46 | 39.4 | 46.8 | 37.9 |
| % F | | | | | | 7.8 | 4.7 | 7.1 | 7.9 | 5.9 | 4.4 | 2.5 | 4.2 | 4.3 | 3.4 | 2.3 | 2.4 | 2 | 3.7 | 3.5 |

Thickness and refractive index were measured on an SCI Filmtek 2000 Reflectometer, 5 point average. Adhesion was measured by a tape pull test. Young's modulus and nanoindentation hardness were measured on an MTS Nanoindenter. Elemental analysis by XPS was measured after a 30 second Ar sputter. The atomic % values reported in the tables do not include hydrogen.

Figure 1B:
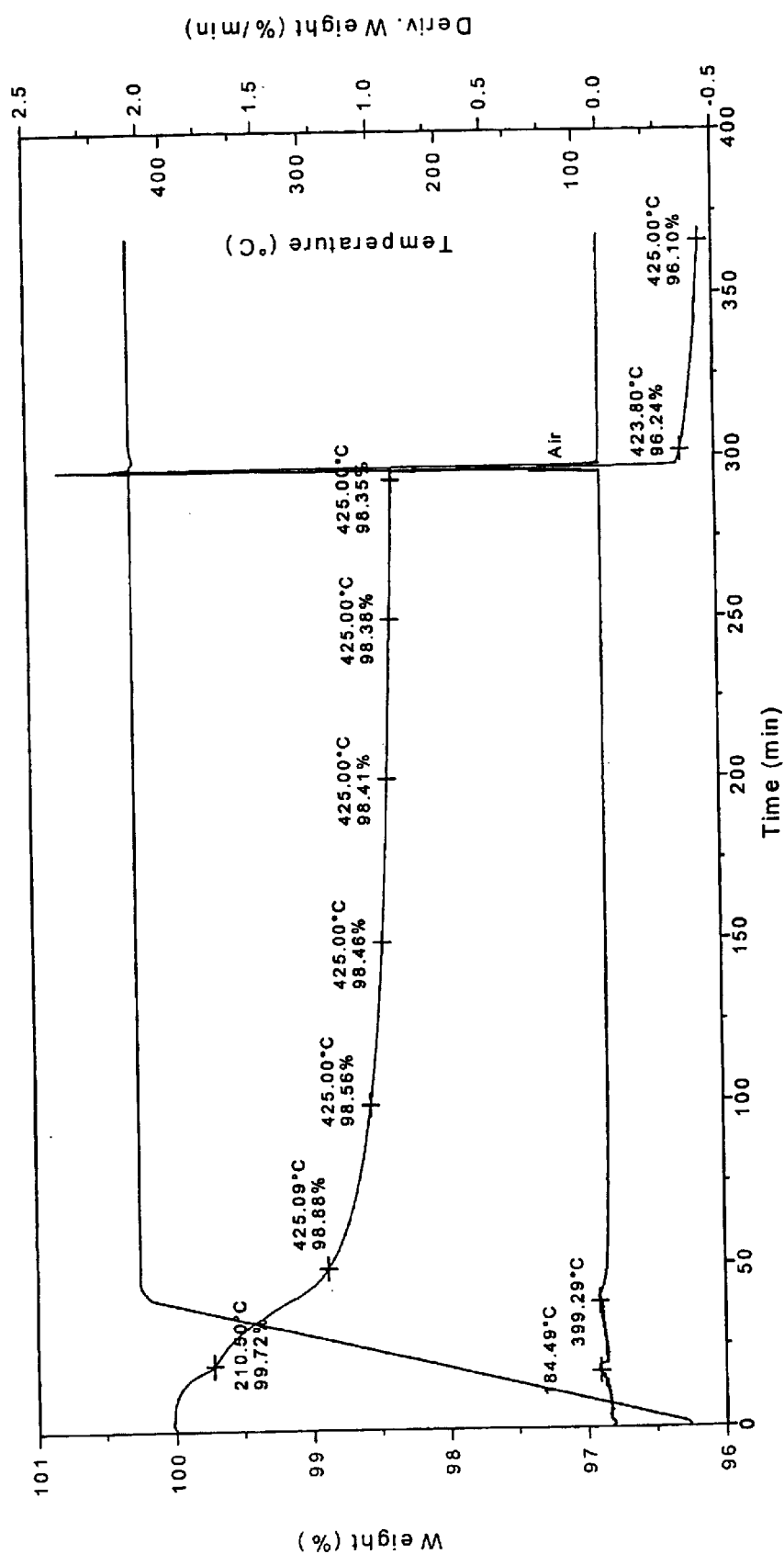
FIG. 1b shows an isothermal TGA of a prior art film.

FIGS. 1a and 1b show Isothermal TGAs at 425° C. under $N_2$ for 5 hours followed by air. These figures show that the thermal stability of the inventive film (Example 16) is slightly superior to OSG type materials under inert ($N_2$ atmosphere). However, upon switching ambient atmosphere to air, a dramatic and rapid weight loss is seen for the OSG material whereas the film of the invention material shows excellent stability.

Figure 2A:
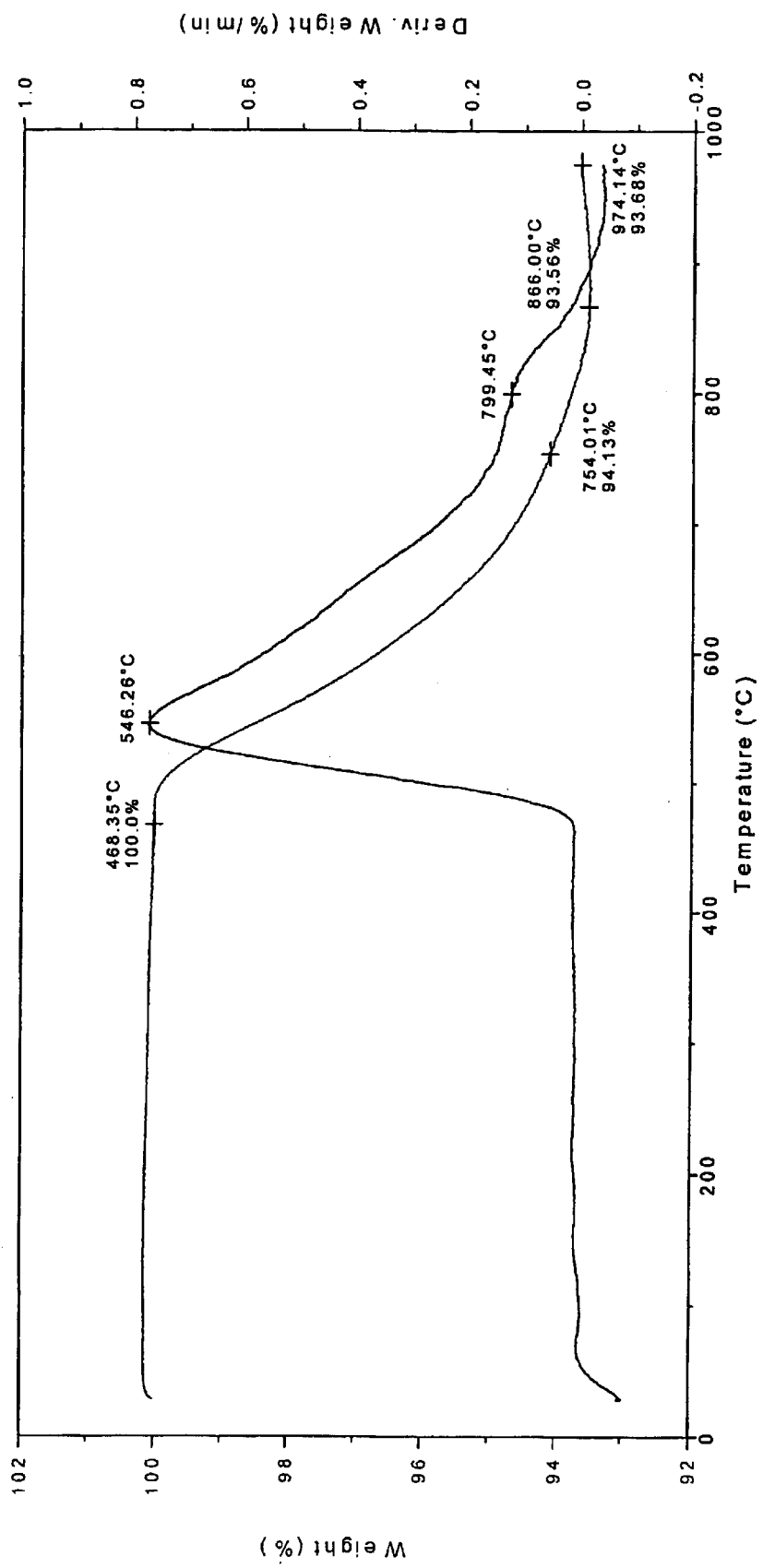
FIG. 2a shows a TGA scan of an embodiment of a film of the invention.
Figure 2B:
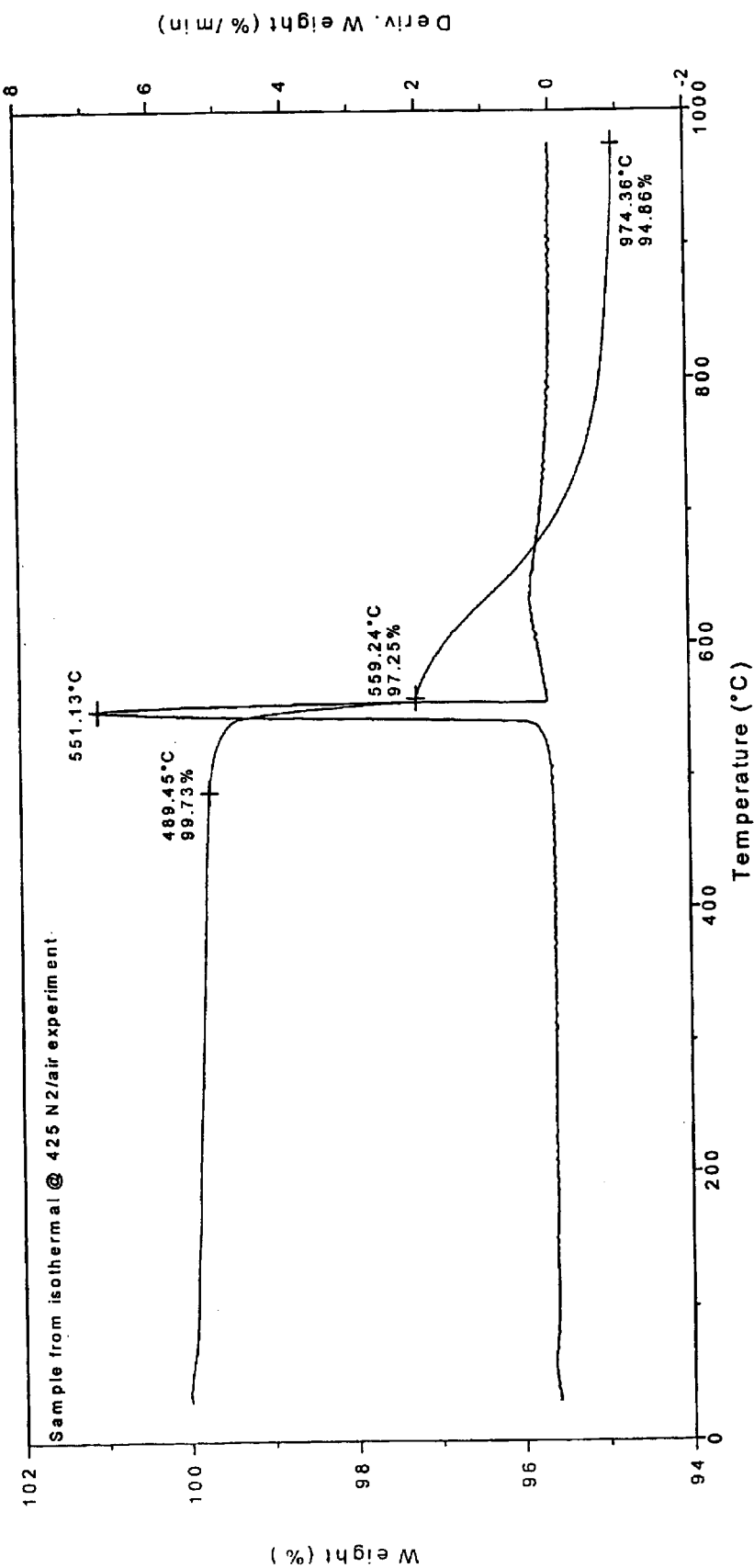
FIG. 2b shows a TGA scan of a prior art film.

FIGS. 2a and 2b show TGA scans in nitrogen or air to 1000° C. after isothermal at 425° C. These figures show the thermal stability of the inventive film (Example 16, shown in FIG. 2a) versus OSG (shown in FIG. 2b) upon scanning to 1000° C. in air. The OSG material shows a much more rapid weight loss starting at about 400° C. when scanning at 10° C./min in nitrogen, whereas the inventive film shows a much less rapid weight loss over an extended period of time and starting only at about 470° C./min when scanned at 10° C./min in air.

Figure 3:
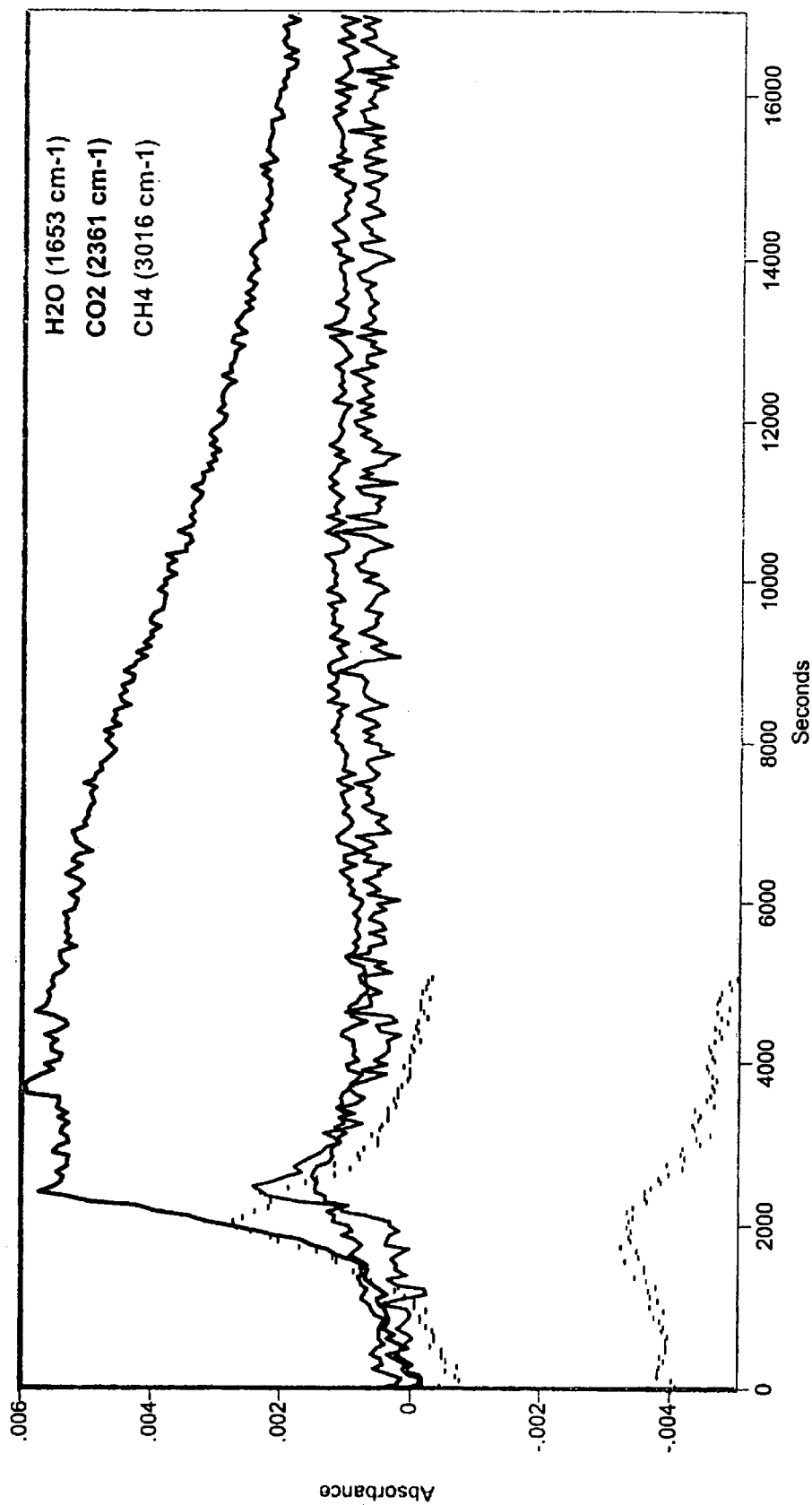
FIG. 3 shows IR profiles of an embodiment of the film of the invention and a prior art film.

FIG. 3 shows IR profiles for the film of Example 16 and OSG at 425° C. isothermal in air. This figure shows that while the inventive film (dotted line profiles) loses only $CO_2$ and water, the OSG material (solid line profiles) losses a substantially larger amount of $CO_2$ as well as water and $CH_4$. There was no indication of any fluorinated organic materials being released from the sample, which would be expected if the material did possess any.

Figure 4:
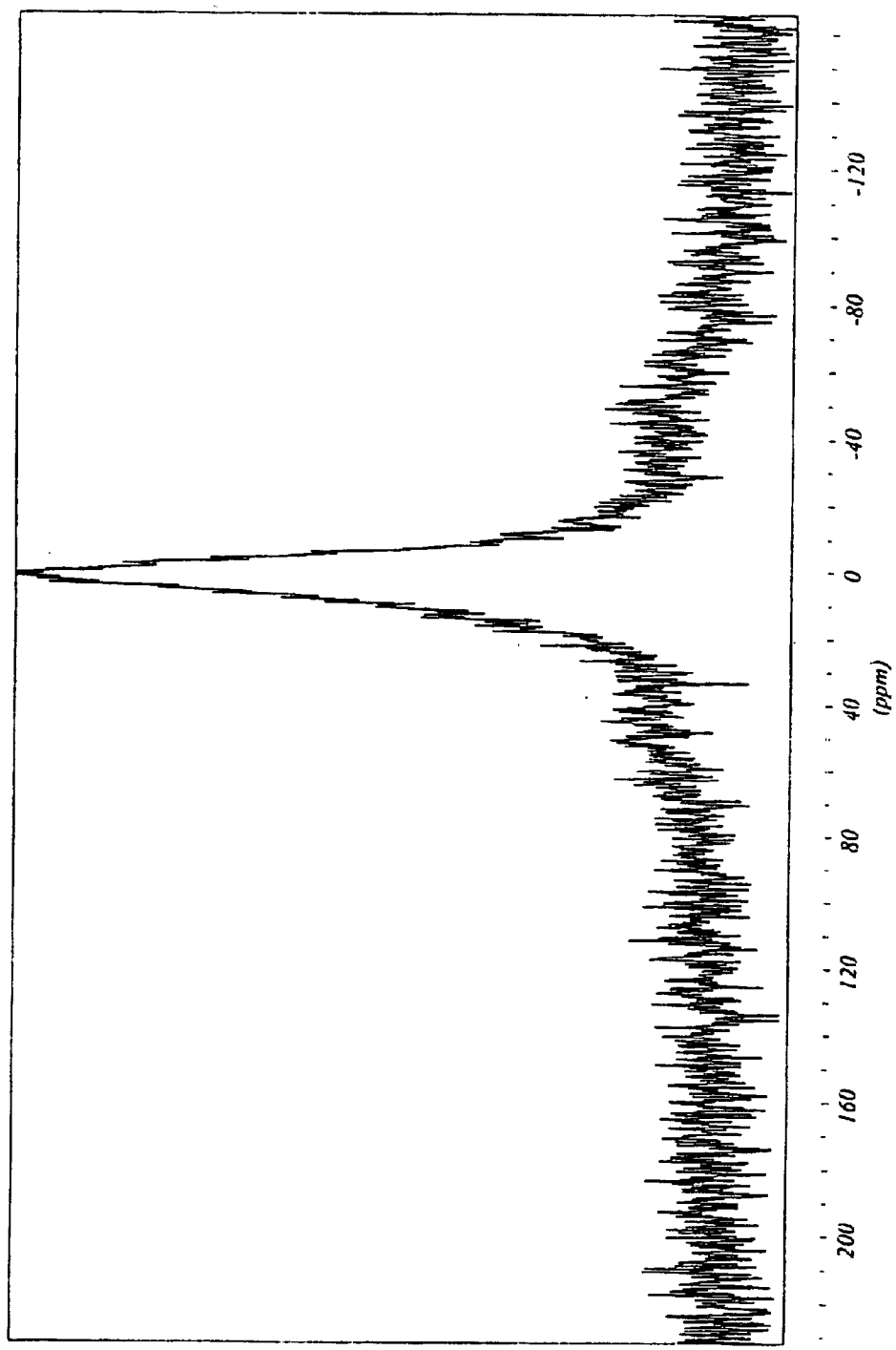
FIG. 4 shows a $^{13}C$ NMR spectrum of an embodiment of the film of the invention.

FIG. 4 shows a $^{13}C$ NMR spectrum of the film of Example 16, in which there is no visible sign of organic fluorine, which would be expected to show a signal at about +90 ppm for —$CH_2F$ up to about +150 ppm for —$CF_3$. The only form of carbon seen by this technique is carbon attached to silicon, showing a response centered around 0 ppm.

Thus, the invention provides films and processes for making such films, wherein the films are substantially or completely free of C—F bonds, and have a low dielectric constant and improved mechanical properties, thermal stability, and chemical resistance (to oxygen, aqueous environments, etc.) relative to OSG materials.

Example 21

A prospective example of the invention based on using 1,3,5,7-tetramethylcyclotetrasiloxane (TMCTS) as the organosilane precursor is shown in Table 4 below for a 200 mm silicon wafer substrate.

TABLE 4

| | |
|---|---|
| Pressure (torr) | 4.0 |
| Substrate temperature (° C.) | 350 |
| Spacing (mil) | 250 |
| RF power (Watts) | 300 |
| TMCTS (g/min) | 1.0 |
| $O_2$ flow (sccm) | 50 |
| $SiF_4$ flow (sccm) | 150 |

The expected k value will be in the range of 2.8 to 3.0, with a Young's modulus of about 15 GPa and a nanoindentation hardness of about 2 GPa.

A prospective example of the invention based on using dimethyldimethoxysilane (DMDMOS) as the organosilane precursor is shown in Table 5 below for a 200 mm silicon wafer substrate.

TABLE 5

| | |
|---|---|
| Pressure (torr) | 4.0 |
| Substrate temperature (° C.) | 350 |
| Spacing (mil) | 250 |
| RF power (Watts) | 500 |
| DMDMOS (g/min) | 1.0 |
| $O_2$ flow (sccm) | 100 |
| $SiF_4$ flow (sccm) | 200 |

The expected k value will be in the range of 2.8 to 3.0, with a Young's modulus of about 15 GPa and a nanoindentation hardness of about 2 GPa.

A prospective example of the invention based on using diethoxymethylsilane (DEMS) as the organosilane precursor is shown in Table 6 below for a 200 mm silicon wafer substrate.

TABLE 6

| | |
|---|---|
| Pressure (torr) | 4.0 |
| Substrate temperature (° C.) | 350 |
| Spacing (mil) | 250 |
| RF power (Watts) | 300 |
| DEMS (g/min) | 1.0 |
| $O_2$ flow (sccm) | 100 |
| $SiF_4$ flow (sccm) | 200 |

The expected k value will be in the range of 2.8 to 3.0, with a Young's modulus of about 15 GPa and a nanoindentation hardness of about 2 GPa.

While the invention has been described in detail and with reference to specific examples thereof, it will be apparent to one skilled in the art that various changes and modifications can be made therein without departing from the spirit and scope thereof.

What is claimed is:

1. A chemical vapor deposition method comprising:
   a. providing a substrate within a vacuum chamber;
   b. introducing into the vacuum chamber gaseous reagents including a fluorine-providing gas, an oxygen-providing gas and at least one precursor gas selected from the group consisting of an organosilane and an organosiloxane; and
   c. applying energy to the gaseous reagents in said chamber to induce reaction of the gaseous reagents and to form on the substrate a film represented by the formula $Si_vO_wC_xH_yF_z$, where v+w+x+y+z=100%, v is from 10 to 35 atomic %, w is from 10 to 65 atomic %, y is from 10 to 50 atomic %, x is from 2 to 30 atomic %, and z is from 0.1 to 15 atomic %, wherein substantially none of the fluorine is bonded to the carbon.

2. The method of claim 1, wherein the energy applying comprises supplying plasma power from 0.02 to 7 watts/cm² based upon a surface area of the substrate.

3. The method of claim 1, wherein the at least one precursor gas is an alkylsilane of the general formula $R^1_nSiR^2_{4-n}$, where n is an integer from 1 to 3; $R^1$ and $R^2$ are independently at least one branched or straight chain $C_1$ to $C_8$ alkyl group, a $C_3$ to $C_8$ substituted or unsubstituted cycloalkyl group, a $C_2$ to $C_{10}$ partially unsaturated alkyl group, a $C_6$ to $C_{12}$ substituted or unsubstituted aromatic, a corresponding linear, branched, cyclic, partially unsaturated alkyl, or aromatic containing alkoxy groups, and $R^2$ is alternatively hydride.

4. The method of claim 3, wherein the alkylsilane is a member selected from the group consisting of methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, trimethylphenoxysilane and phenoxysilane.

5. The method of claim 1, wherein at least one of the fluorine-providing gas and the at least one precursor has the formula $R^1{}_nSiF_{4-n}$, where n is an integer from 1 to 3; and $R^1$ is at least one branched or straight chain $C_1$ to $C_8$ alkyl group, a $C_3$ to $C_8$ substituted or unsubstituted cycloalkyl group, a $C_2$ to $C_{10}$ partially unsaturated alkyl group, a $C_6$ to $C_{12}$ substituted or unsubstituted aromatic, a corresponding linear, branched, cyclic, partially unsaturated alkyl, or aromatic containing alkoxy groups.

6. The method of claim 5, wherein there is more than one said organosilane, including a fluorinated organosilane.

7. The method of claim 5, wherein at least one of the fluorine-providing gas and the at least one precursor is fluorotrimethylsilane, difluorodimethylsilane methyltrifluorosilane, flurotriethoxysilane or difluorodimethoxysilane.

8. The method of claim 1, wherein the at least one precursor is a linear organosiloxane of Formula I: $R^1(R^2{}_2SiO)_nSiR^2{}_3$ where n is an integer from 1 to 10 or a cyclic organosiloxane of Formula II: $(R^1R^2SiO)_n$ where n is an integer from 2 to 10; $R^1$ and $R^2$ are independently at least one branched or straight chain $C_1$ to $C_8$ alkyl group, a $C_3$ to $C_8$ substituted or unsubstituted cycloalkyl group, a $C_2$ to $C_{10}$ partially unsaturated alkyl group, a $C_6$ to $C_{12}$ substituted or unsubstituted aromatic, or a corresponding linear, branched, cyclic, partially unsaturated alkyl, or aromatic containing alkoxy groups, and $R^2$ is alternatively hydride.

9. The method of claim 8, wherein the organosiloxane is selected from the group consisting of 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane and octamethyltrisiloxane.

10. The method of claim 1, wherein at least one of the at least one precursor gas and the fluorine-providing gas is a cyclic or linear organosiloxane, which contains at least one Si—F bond.

11. The method of claim 10, wherein there is more than one said organosilane, including a fluorinated organosilane.

12. The method of claim 1, wherein the at least one precursor is a linear organosilane oligomer of the general formula $R^2(SiR^1R^2)_nR^2$ where n is an integer from 2 to 10 or a cyclic organosilane oligomer of the general formula $(SiR^1R^2)_n$, where n is an integer from 3 to 10; $R^1$ and $R^2$ are at least one branched or straight chain $C_1$ to $C_8$ alkyl group, a $C_3$ to $C_8$ substituted or unsubstituted cycloalkyl group, a $C_2$ to $C_{10}$ partially unsaturated alkyl group, a $C_6$ to $C_{12}$ substituted or unsubstituted aromatic, or a corresponding linear, branched, cyclic, partially unsaturated alkyl, or aromatic containing alkoxy groups, and $R^2$ is alternatively hydride.

13. The method of claim 12, wherein the linear organosilane oligomer is selected from the group consisting of 1,2-dimethyldisilane, 1,1,2,2-tetramethyldisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisilane.

14. The method of claim 1, wherein at least one of the organosilane and the fluorine-providing gas is a linear or cyclic organosilane oligomer with at least one Si—F bond.

15. The method of claim 14, wherein there is more than one said organosilane, including a fluorinated organosilane.

16. The method of claim 1, wherein the at least one precursor is a cyclic alkylsilane, a cyclic alkoxysilane or contains at least one alkoxy or alkyl bridge between a pair of silicon atoms.

17. The method of claim 16, wherein the at least one precursor is 1,2-disilanoethane, 1,3-disilanopropane, dimethylsilacyclobutane, 1,2-bis(trimethylsiloxy) cyclobutene, 1,1-dimethyl-1-sila-2,6-dioxacyclohexane, 1,1-dimethyl-1-sila-2-oxacyclohexane, 1,2-bis (trimethylsiloxy)ethane, 1,4-bis(dimethylsily)benzene or 1,3-dimethylsilacyclobutane.

18. The method of claim 1, wherein the at least one precursor contains a reactive side group selected from the group consisting of an epoxide, a carboxylate, an alkyne, a diene, a phenyl ethynyl, a strained cyclic group and a $C_4$ to $C_{10}$ group which can sterically hinder or strain the at least one precursor gas.

19. The method of claim 1, wherein a mixture of more than one said at least one precursor gas is introduced into the vacuum chamber.

20. The method of claim 1, wherein the fluorine-providing gas is selected from the group consisting of $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds.

21. The method of claim 1, wherein the fluorine-providing gas is $SiF_4$.

22. The method of claim 1, wherein the oxygen-providing gas is $O_2$, $N_2O$, ozone, hydrogen peroxide, NO, $NO_2$, $N_2O_4$, or mixtures thereof.

23. The method of claim 1, further comprising introducing at least one inert gas into the vacuum chamber.

24. The method of claim 1, further comprising introducing at least one additional reactive substance into the vacuum chamber.

25. The method of claim 24, wherein the at least one additional reactive substance is a gaseous or liquid organic substance, $NH_3$, $H_2$, $CO_2$, or CO.

26. The method of claim 25, wherein the organic substance is selected from the group consisting of $CH_4$, $C_2H_6$, $C_2H_4$, $C_2H_2$, $C_3H_8$, benzene, naphthalene, toluene and styrene and provides carbon for said reaction.

27. The method of claim 1, wherein most of the hydrogen is bonded to the carbon.

28. The method of claim 1, wherein the film has a dielectric constant of less than 3.5.

29. The method of claim 1, wherein the film has a dielectric constant of less than 3.0.

30. The method of claim 1, wherein the film has a modulus of elasticity and a nanoindentation hardness greater than those of an organosilica glass film stoichiometrically equivalent to the film but for the absence of fluorine in the organosilica glass film.

31. The method of claim 1, wherein the film has a density of less than 2.0 g/cc.

32. The method of claim 1, wherein the film has a density of less than 1.5 g/cc.

33. The method of claim 32, further comprising adding a porogen to the gaseous reagents to provide said density.

34. The method of claim 1, wherein the film has a pore size less than 5 nm in equivalent spherical diameter, as determined by small angle neutron scattering or positron annihilation lifetime spectroscopy.

35. The method of claim 1, wherein the film has a pore size less than 2.5 nm in equivalent spherical diameter, as determined by small angle neutron scattering or positron annihilation lifetime spectroscopy.

36. The method of claim 1, further comprising depositing the film on a semiconductor substrate at a thickness of 0.002 to 10 microns.

37. The method of claim 1, further comprising using the film as an insulation layer, an interlayer dielectric layer, an intermetal dielectric layer, a capping layer, a chemical-mechanical planarization or etch stop layer, a barrier layer or an adhesion layer in an integrated circuit.

38. The method of claim 1, wherein the film has an average weight loss of less than 1.0 wt %/hr isothermal at 425° C. under $N_2$.

39. The method of claim 1, wherein the film has an average weight loss of less than 1.0 wt %/hr isothermal at 425° C. under air.

40. The method of claim 1, wherein said energy is applied by at least one of thermal, plasma, pulsed plasma, helicon plasma, high density plasma, inductively coupled plasma, and remote plasma techniques.

41. The method of claim 1, wherein said reaction comprises generating a capacitively coupled plasma.

42. The method of claim 1, wherein said film is deposited at a deposition rate of at least 50 nm/min.

43. The method of claim 1, wherein a flow rate for each of said gaseous reagents ranges from 10 to 5000 sccm per single 200 mm wafer chamber.

44. The method of claim 1, wherein a pressure in the vaccum chamber is 0.01 to 600 torr.

45. The method of claim 1, wherein a pressure in the vacuum chamber is 1 to 10 torr.

46. The method of claim 1, wherein said film forms a conformal coating.

47. The method of claim 1, wherein the film deposited on a non-patterned or smooth surface has a thickness that changes less than 2% over one standard deviation across the substrate with a 10% outermost edge exclusion.

48. The method of claim 1, further comprising post-treating the film after deposition.

49. The method of claim 48, wherein said post-treating comprises at least one of thermal treatment, plasma treatment and chemical treatment.

50. The method of claim 1, wherein the film has a bulk density of less than 1.5 g/cc, a pore size less than 2.5 nm equivalent spherical diameter, as determined by small angle neutron scattering or positron annihilation lifetime spectroscopy, wherein most of the hydrogen is bonded to the carbon, and the film is deposited on the substrate as an insulation layer, an interlayer dielectric layer, an intermetal dielectric layer, a capping layer, a chemical-mechanical planarization or etch stop layer, a barrier layer or an adhesion layer in an integrated circuit.

51. The method of claim 1, wherein the gaseous reagents include at least one molecule functioning as at least two of the fluorine-providing gas, the oxygen-providing gas and the at least one precursor gas.

52. The method of claim 1, wherein the gaseous reagents include at least one molecule functioning as the fluorine-providing gas, the oxygen-providing gas and the at least one precursor gas.

53. A method for forming an organofluorosilicate glass film substantially free of C—F bonds, the method comprising:
   introducing gaseous reagents comprising a fluorine providing gas, an oxygen providing gas, and at least one silicon containing precursor gas selected from an organosilane, an organosiloxane and mixtures thereof wherein each of the gaseous reagents are free of C—F bonds into a reaction chamber comprising a substrate; and
   applying energy to the gaseous reagents to deposit the organofluorosilicate glass film onto at least a portion of the substrate wherein there is substantially no signal at about +90 ppm for —$CH_2F$ and about +150 ppm for —$CF_3$ as determined by carbon-13 NMR.

54. The method of claim 53 further comprising treating the organofluorosilicate glass film with at least one treatment selected from thermal treatment, plasma treatment, chemical treatment, and combinations thereof.

55. A method for forming an organofluorosilicate glass film substantially free of C—F bonds, the method comprising:
   introducing gaseous reagents comprising a fluorine providing gas, an oxygen providing gas, and at least one silicon containing precursor gas selected from an organosilane, an organosiloxane, and mixtures thereof wherein each of the gaseous reagents are free of C—F bonds into a reaction chamber comprising a substrate; and
   applying energy to the gaseous reagents to deposit the organofluorosilicate glass film onto at least a portion of the substrate wherein the organofluorosilicate glass film has a nano-indentation hardness of about 1.6 GPa or greater, a Young's Modulus of about 10 GPa or greater, and a dielectric constant of about 3.0 or below.

56. A method for forming an organofluorosilicate glass film having the formula formula $Si_vO_wC_xH_yF_z$, where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, the method comprising:
   introducing gaseous reagents comprising a fluorine providing gas, an oxygen providing gas, and at least one silicon containing precursor gas selected from an organosilane, an organosiloxane and mixtures thereof wherein each of the gaseous reagents are free of C—F bonds into a reaction chamber comprising a substrate, and
   applying energy to the gaseous reagents to deposit the organofluorosilicate glass film onto at least a portion of the substrate wherein the ratio of atomic percent of carbon to silicon in the film is below 0.60 and wherein the ratio of atomic percent of fluorine to silicon in the film ranges from about 0.06 to about 0.22 and wherein the film is substantially free of C—F bonds.

* * * * *